US010594312B2

(12) United States Patent
Fields et al.

(10) Patent No.: US 10,594,312 B2
(45) Date of Patent: Mar. 17, 2020

(54) HIGH SPEED PIN DIODE DRIVER CIRCUIT

(71) Applicant: MACOM Technology Solutions Holdings, Inc., Lowell, MA (US)

(72) Inventors: Wesley Fields, San Jose, CA (US); Rockford C. Curby, Sunnyvale, CA (US)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 0 days.

(21) Appl. No.: 16/275,968

(22) Filed: Feb. 14, 2019

(65) Prior Publication Data
US 2020/0021283 A1    Jan. 16, 2020

Related U.S. Application Data

(63) Continuation of application No. 15/430,994, filed on Feb. 13, 2017, now abandoned.

(51) Int. Cl.
*H03K 17/04*     (2006.01)
*H03K 17/082*    (2006.01)
*H03K 17/74*     (2006.01)
(52) U.S. Cl.
CPC ..... *H03K 17/0406* (2013.01); *H03K 17/0822* (2013.01); *H03K 17/74* (2013.01)
(58) Field of Classification Search
None
See application file for complete search history.

(56) References Cited

U.S. PATENT DOCUMENTS

| 4,196,381 A | * | 4/1980 | Standing | H01P 1/15 323/350 |
| 4,251,742 A | * | 2/1981 | Beelitz | H03K 17/666 326/30 |
| 4,486,722 A | * | 12/1984 | Landt | H03H 7/40 327/503 |
| 4,507,629 A | * | 3/1985 | Frank | H01P 1/185 333/1.1 |
| 4,899,109 A | * | 2/1990 | Tropp | G01R 33/3875 324/319 |
| 5,144,157 A | * | 9/1992 | Russell | H03K 17/667 327/108 |
| 5,339,041 A | * | 8/1994 | Nitardy | H03F 1/0222 330/10 |
| 5,654,679 A | * | 8/1997 | Mavretic | H03H 7/40 333/17.3 |
| 9,698,774 B2 | * | 7/2017 | Liu | H03K 17/74 |
| 2015/0035710 A1 | * | 2/2015 | Lin | H01Q 1/283 343/745 |

* cited by examiner

*Primary Examiner* — Cassandra F Cox
(74) *Attorney, Agent, or Firm* — Thomas | Horstemeyer, LLP; Michael J. D'Aurelio; Jason M. Perilla

(57) ABSTRACT

An apparatus includes a first circuit and a second circuit. The first circuit may be configured to inject charge into an I-region of a PIN diode in response to a first state of a control signal. The second circuit may be configured to remove charge from the I-region of the PIN diode in response to a second state of the control signal. A radio frequency switching time of the apparatus is generally about two orders of magnitude lower than a carrier lifetime of the PIN diode.

20 Claims, 7 Drawing Sheets

HIGH SPEED PIN DIODE DRIVER CIRCUIT

This application is a continuation of U.S. patent application Ser. No. 15/430,994, titled "HIGH SPEED PIN DIODE DRIVER CIRCUIT," filed Feb. 13, 2017, the complete disclosure of which is hereby fully incorporated herein by reference.

FIELD OF THE INVENTION

The invention relates to radio frequency and microwave switching generally and, more particularly, to a method and/or apparatus for implementing a high speed PIN diode driver circuit.

BACKGROUND

For switching applications needing fast switching with high linearity, PIN diodes are the technology of choice. Recent developments in Gallium Nitride (GaN) transistor-based products have demonstrated medium power switching capabilities on par with PIN diodes. However, when compared side-by-side, GaN transistor-based products still fall 50 to 60 dB short in linearity. A typical PIN diode has a 3rd Order Intercept Point (IP3) on the order of 100 to 110 decibel-milliwatt (dBm). A GaN based switch in contrast has a typical IP3 on the order of 50 to 60 dBm. As data rates increase and radar requirements become more and more demanding, system designers are seeking a driver circuit that can switch PIN diodes with faster switching speeds.

It would be desirable to implement a high speed PIN diode driver circuit.

SUMMARY

The invention concerns an apparatus including a first circuit and a second circuit. The first circuit may be configured to inject charge into an I-region of a PIN diode in response to a first state of a control signal. The second circuit may be configured to remove charge from the I-region of the PIN diode in response to a second state of the control signal. A radio frequency switching time of the apparatus is generally about two orders of magnitude lower than a carrier lifetime of the PIN diode.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
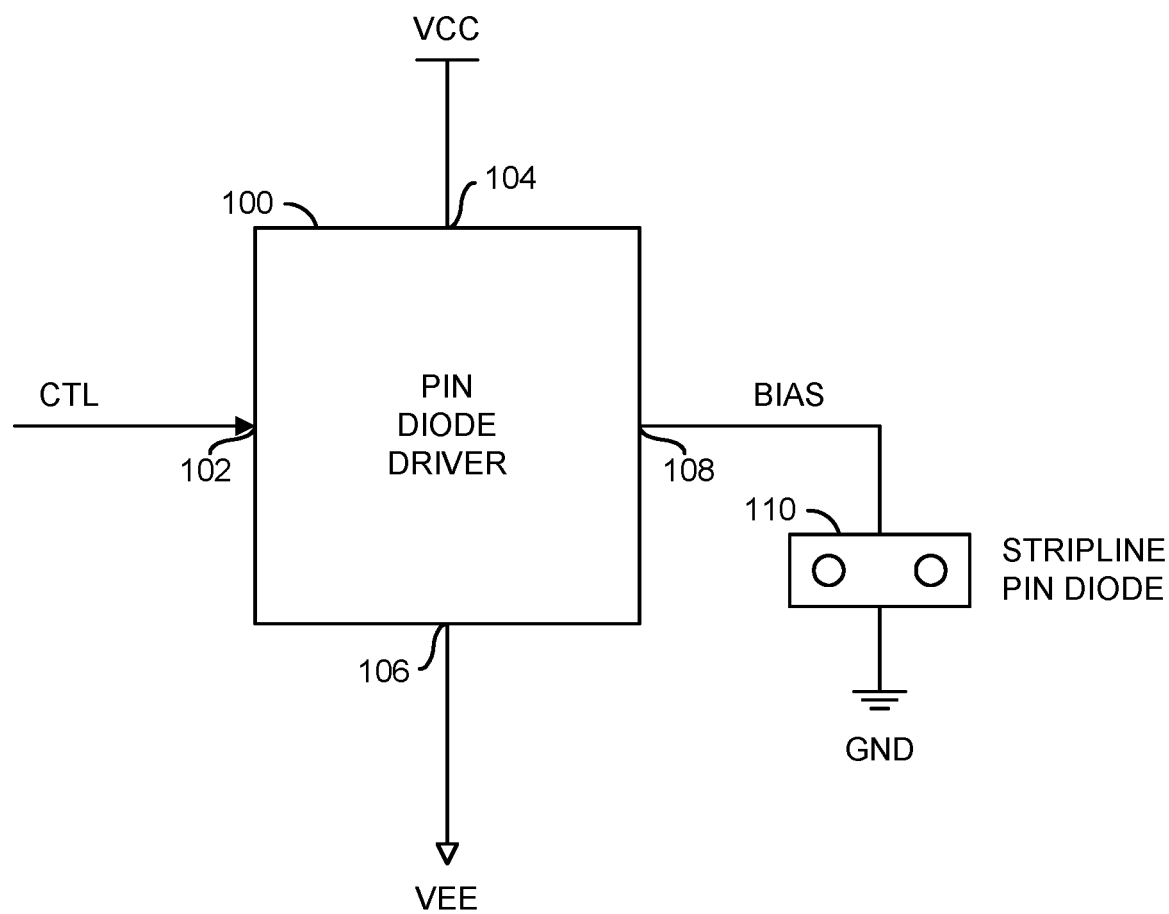
FIG. 1 is a block diagram illustrating a PIN diode driver circuit in accordance with an example embodiment of the invention.

Embodiments of the present invention include providing a high speed PIN diode driver circuit that may (i) switch a PIN diode faster than a carrier lifetime of the diode divided by 100, (ii) improve the switching speed by an order of magnitude over conventional driver circuits, (iii) utilize large spiking currents for increased switching speed, (iv) provide faster PIN diode switching speeds to support increasing data rates and increasingly demanding radar requirements, (v) be implemented using discrete semiconductor devices, (vi) be implemented using Bi-CMOS technology, and/or (vii) be implemented as a monolithic microwave integrated circuit (MMIC).

PIN diodes are widely used in radio frequency (RF), ultra high frequency (UHF), and microwave circuits. At RF, UHF and microwave frequencies, an impedance of the PIN diode may be controlled by applying a DC excitation. A unique feature of the PIN diode is its ability to control large amounts of RF power with small levels of DC. In general, the PIN diode acts as a current controlled resistor at radio and microwave frequencies.

The PIN diode is a silicon or Gallium Arsenide (GaAs) semiconductor diode in which a high resistivity intrinsic I-region is sandwiched between a P-type region and an N-type region. When the PIN diode is forward biased, holes and electrons (charge carriers) are injected into the I-region. However, these carriers do not immediately annihilate each other. Instead, the carriers stay alive for an average time called the carrier lifetime (represented by the Greek letter tau ($\tau$)). The lifetime of the carriers results in an average stored charge, Q, which lowers the effective series resistance (RS) value of the I-region. When the PIN diode is at zero or reverse bias, there is no stored charge in the I-region and the PIN diode appears as a capacitance (CT) shunted by a parallel resistance (RP).

PIN diodes are generally specified using parameters including (i) series resistance under forward bias RS, (ii) total capacitance at zero or reverse bias CT, (iii) parallel resistance at zero or reverse bias RP, (iv) maximum allowable DC reverse voltage VR, (v) carrier lifetime T, (vi) average thermal resistance $\theta$AVE or (vii) maximum average power dissipation PD, and (viii) pulse thermal impedance $\theta$pulse or (ix) maximum peak power dissipation PP. By varying the I-region width (e.g., the thickness of the I-region between the P-type and N-type regions) and the diode area (e.g., the surface area covered by the P-type and N-type regions) it is possible to construct PIN diodes of different geometries that result in the same RS and CT characteristics.

The switching speed in any application depends on the driver circuit as well as the PIN diode. The PIN diode generally has two switching speeds: from forward bias to reverse bias TFR, and from reverse bias to forward bias TRF. The PIN diode characteristic that affects TFR is the carrier lifetime T. The switching speed from reverse bias to forward bias TRF depends primarily on I-region width (W).

Figure 3:
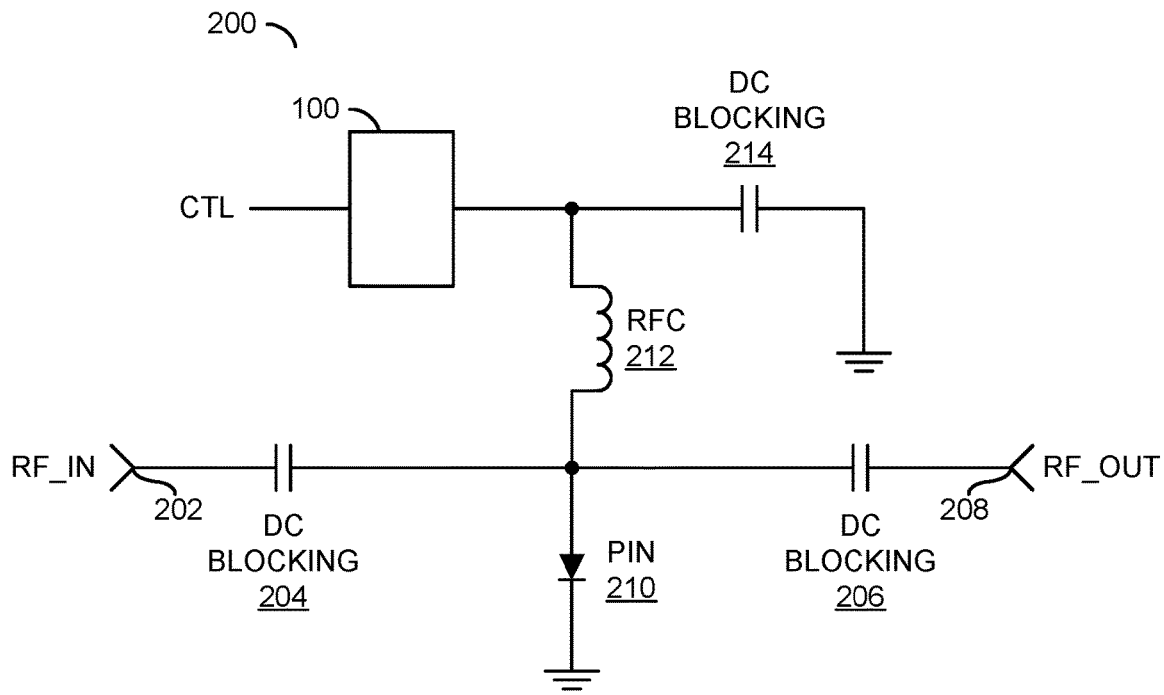
FIG. 3 is a diagram illustrating an example application of the driver circuit of FIG. 2 in an example shunt PIN diode radio frequency (RF) attenuator or switch.
Figure 4:
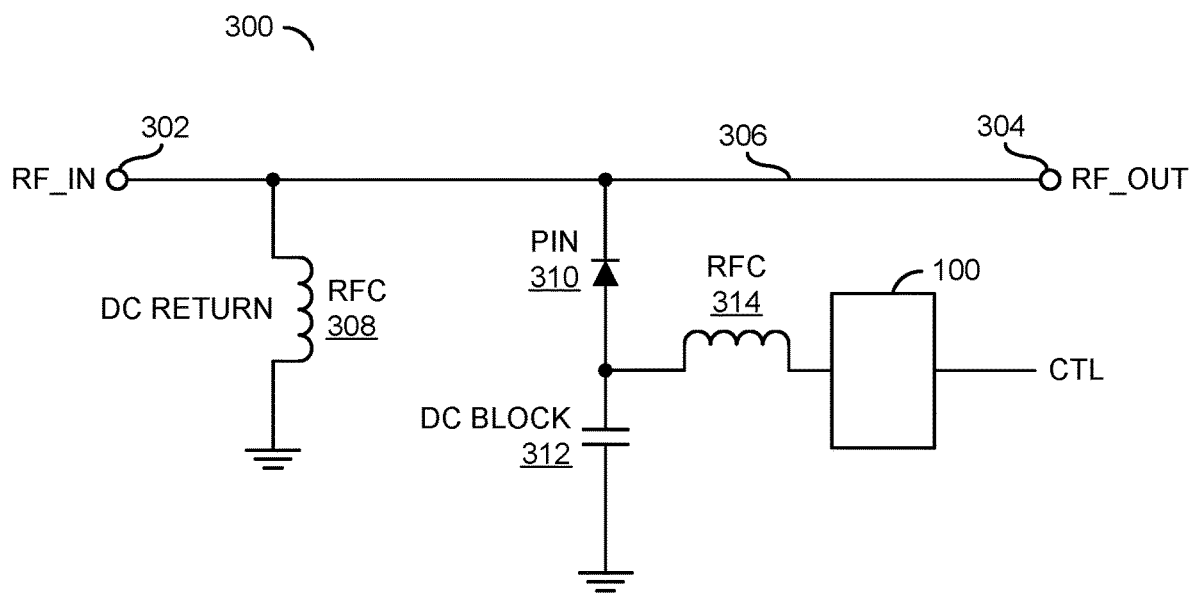
FIG. 4 is a diagram illustrating another example application of the driver circuit of FIG. 2 in another example shunt PIN diode RF attenuator or switch.
Figure 8:
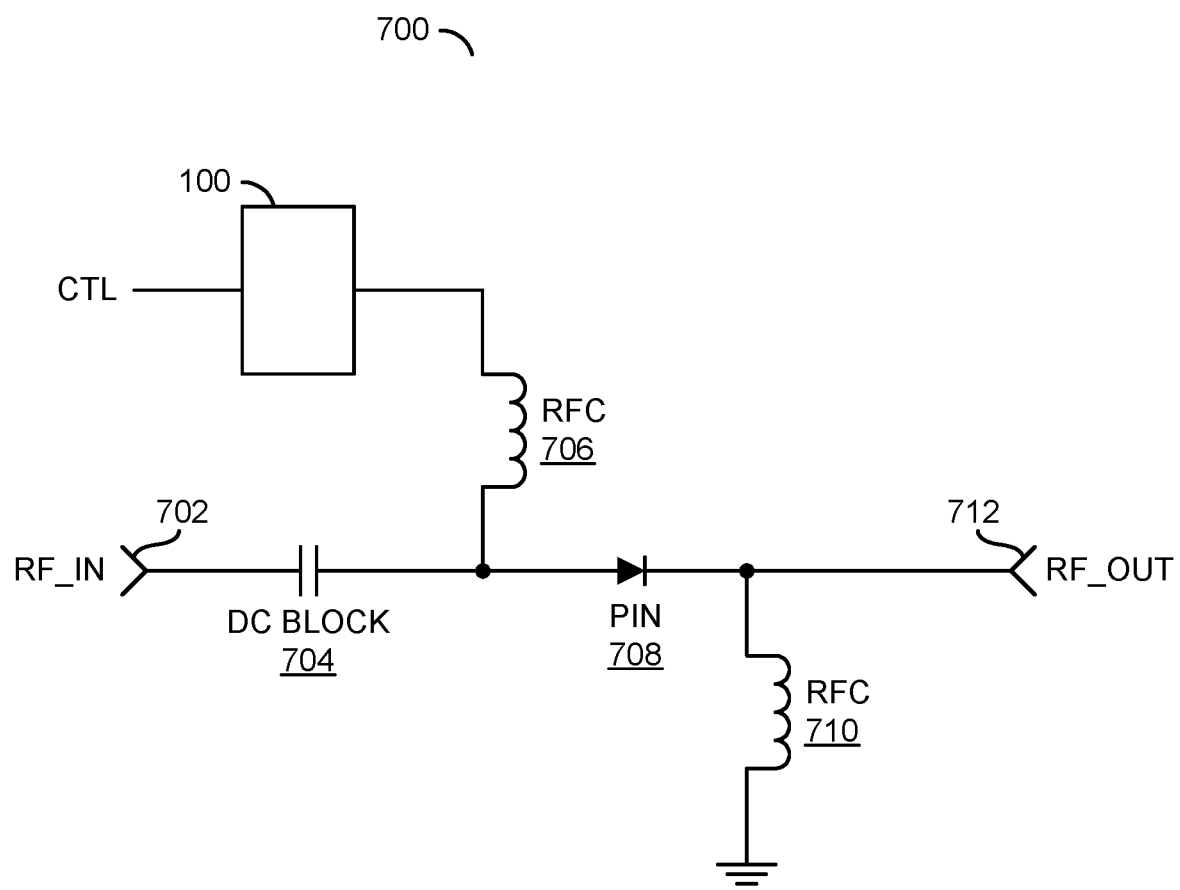
FIG. 8 is a diagram illustrating an example application of the driver circuit of FIG. 2 in an example series PIN diode RF attenuator or switch.

PIN diodes are commonly used as a switching element to control RF signals. In these applications, the PIN diode can be biased to either a high or low impedance device state, depending on the level of stored charge in the I-region. A simple untuned single-pole, single throw (SPST) switch may be designed using either a single series-connected or single shunt-connected PIN diode as shown in FIGS. 3, 4, and 8. The series-connected PIN diode switch is commonly used when minimum insertion loss is desired over a broad frequency range. The series-connected PIN diode switch design is easier to physically realize using printed circuit techniques, since no through holes are needed in the circuit board. In contrast to the single series-connected PIN diode, a single shunt-connected PIN diode may produce higher isolation values across a wider frequency range and may result in a design capable of handling more power (e.g., the shunt mounted PIN diode is easier to heat sink).

In an attenuator application the resistance characteristic of the PIN diode may be exploited not only at the extreme high and low values as in switches but at the finite values in between. The resistance characteristic of a PIN diode when forward biased generally depends on the I-region width (W), the carrier lifetime ($\tau$), and the hole and electron mobilities ($\mu P$, $\mu n$).

In various embodiments, a high speed PIN diode spiking driver circuit is provided that is capable of providing a radio frequency (RF) switching time of a PIN diode that is about two orders of magnitude lower than the carrier lifetime of the PIN diode (e.g., $\tau$ divided by 100), in the most difficult direction where charge needs to be withdrawn from the I-region of the PIN diode. In various embodiments, a turn-off time of 125 ns has also been achieved using the same high speed PIN diode spiking driver circuit. Using a 30% to 70% criterion, a shunt stripline PIN diode coupled to a driver circuit in accordance with an example embodiment of the invention demonstrated an RF turn on of 40 ns, which is equivalent to the 90% lifetime divided by 112. Since the diode is a shunt topology, the RF turn on (turning the shunt diode off and removing charge from the I-region) should be the most difficult (slowest) direction for switching. However, the opposite was observed. Compared with the RF turn-on, the RP turn-off (turning the shunt diode on and inserting charge into the I-region) was observed as slower (e.g., about 125 ns).

Referring to FIG. 1, a block diagram illustrating a PIN diode driver circuit 100 in accordance with an embodiment of the invention is shown. In various embodiments, the PIN driver circuit 100 provides a high speed PIN diode spiking driver circuit capable of radio frequency (RF) switching a PIN diode faster than the carrier lifetime of the PIN diode divided by 100, in the most difficult direction where charge needs to be withdrawn from the I-region of the PIN diode. The PIN diode driver circuit 100 may have a first input 102, a second input 104, a third input 106 and an output 108. The input 102 may receive a signal (e.g., CTL). The input 104 may receive a first supply voltage (e.g., VCC). The input 106 may receive a second supply voltage (e.g., VEE). The output 108 may present a signal (e.g., BIAS).

In various embodiments, the output 108 of the driver circuit 100 may be coupled (e.g., through an inductor) to an anode terminal of a PIN diode 110. In a shunt topology switch/attenuator, a cathode terminal of the PIN diode 110 may be coupled (e.g., directly or through an inductor) to a circuit ground potential (e.g., GND). In an example, the PIN diode 110 may be implemented as a shunt stripline PIN diode. In various embodiments, both silicon (Si) and gallium arsenide (GaAs) semiconductor diodes may be driven using the circuit 100.

The signal CTL may implement a control signal. In various embodiments, the signal CTL may be compliant with transistor-transistor-logic (TTL) signal levels. TTL signals are single-ended, which means that each signal consists of a voltage on one wire, referenced to a system ground potential (e.g., GND). A "LOW" voltage level is generally implemented as zero to 0.8 volts. A "HIGH" voltage level is generally implemented as 2 volts to 5 volts. In an example, the signal CTL may swing between a positive voltage level (e.g., approximately 5 volts) and the circuit ground potential GND (e.g., approximately 0 volts). In various embodiments, the signal CTL may be received from a controller (not shown).

In various embodiments, a voltage level of the first supply voltage VCC is greater than a voltage level of the second supply voltage VEE. In some embodiments, the first supply voltage VCC is implemented as a positive supply voltage (e.g., 5V) and the second supply voltage VEE is implemented as a negative supply voltage VEE (e.g., −25V), measured relative to the circuit ground potential GND. However, other voltage levels may be implemented accordingly to meet the design criteria of a particular application.

In various embodiments, the signal BIAS may be used to control biasing of the PIN diode 110. For example, the signal BIAS may be coupled (e.g., through a radio frequency choke or inductor) to the anode of the PIN diode 110. In various embodiments, the PIN diode 110 may be part of a shunt mode radio frequency (RF) or microwave attenuator or switch (described below in connection with FIGS. 3 and 4) or a serial mode radio frequency (RF) or microwave attenuator or switch (described below in connection with FIG. 8).

Figure 2:
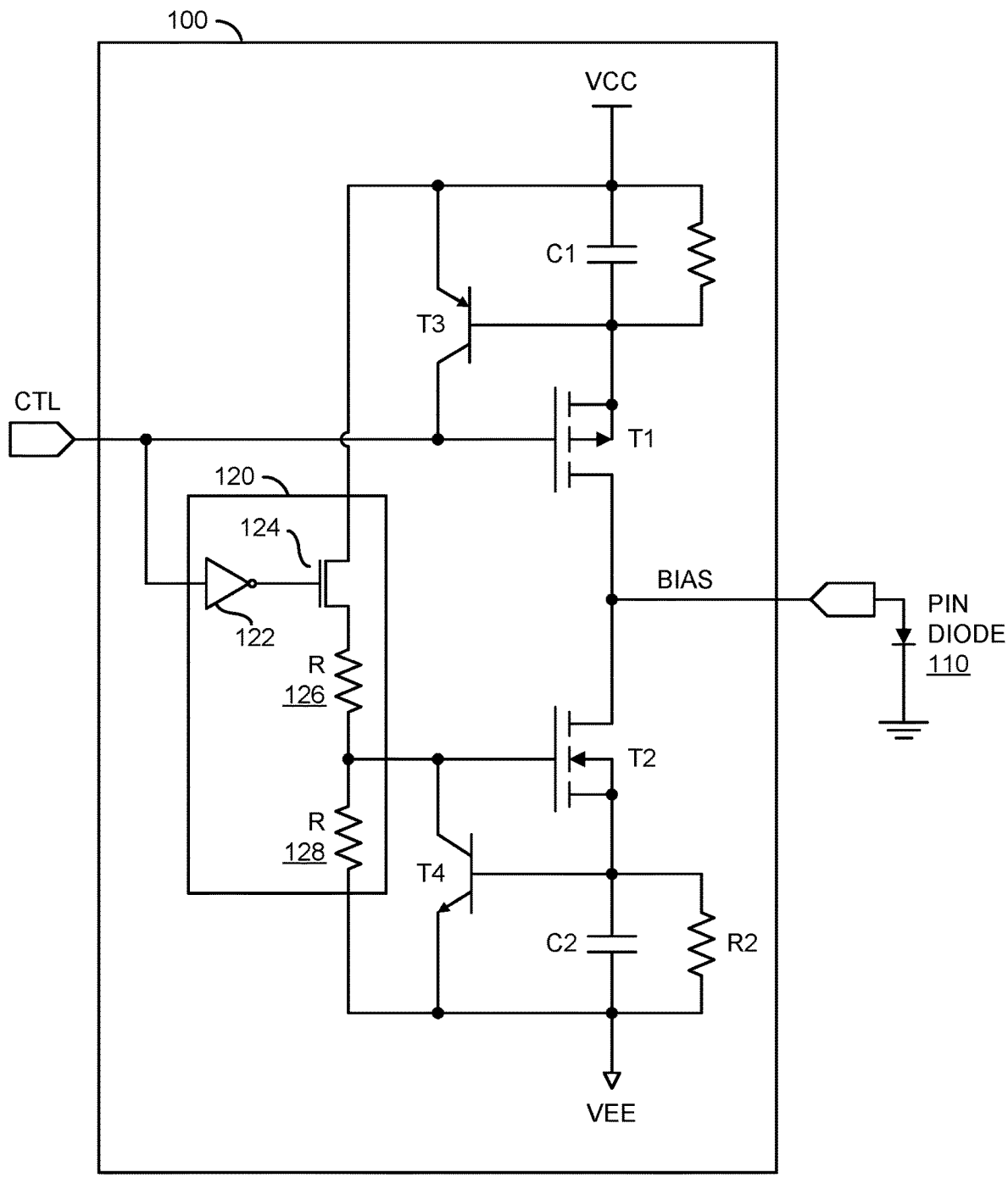
FIG. 2 is a diagram illustrating an example implementation of the driver circuit of FIG. 1.

Referring to FIG. 2, a schematic diagram is shown illustrating an example implementation of the driver circuit 100 in accordance with an example embodiment of the invention. In various embodiments, the circuit 100 may be realized using one or more of chip-and-wire (hybrid) construction, surface-mount (SMT) construction, and/or monolithic microwave integrated circuit (MMIC) construction. In an example, the circuit 100 may comprise a first transistor T1, a second transistor T2, a third transistor T3, a fourth transistor T4, a first capacitor C1, a second capacitor C2, a first resistor R1, a second resistor R2, and a level shifter circuit 120.

In various embodiments, the first and second transistors T1 and T2 may be implemented as enhancement mode metal-oxide-semiconductor field effect transistors (MOSFETs). In an example, the transistor T1 may be implemented as a p-channel MOSFET and the transistor T2 may be implemented as a n-channel MOSFET. In some embodiments, the transistors T1 and T2 may be implemented using a complementary metal-oxide-semiconductor (CMOS) process (or technology) as a CMOS transistor pair. However, other technologies may be used to meet the design criteria of a particular application.

In various embodiments, the transistors T3 and T4 may be implemented as bipolar junction transistors (BJTs). The transistor T3 may be implemented as a PNP bipolar junction transistor. The transistor T4 may be implemented as an NPN bipolar junction transistor. In some embodiments, the transistors T1, T2, T3, and T4 may be implemented as discrete semiconductor devices. In some embodiments, the transistors T1, T2, T3, and T4 may be implemented on a single integrated circuit substrate (e.g., using a BiCMOS process).

The first supply voltage VCC may be presented to an emitter terminal of the transistor T3, a first terminal of the capacitor C1 and a first terminal of the resistor R1. A base terminal of the transistor T3 may be connected to a second terminal of the capacitor C1, a second terminal of the resistor R1 and a source terminal of the transistor T1. A bulk (or body) terminal of the transistor T1 may be connected (internally or externally) to the source terminal of the transistor T1. The signal CTL may be presented to an input node formed by connection of a collector terminal of the transistor T3, a gate terminal of the transistor T1 and an input of the level shifter 120.

An output of the level shifter 120 may be presented to a collector terminal of the transistor T4 and a gate terminal of the transistor T2. A base terminal of the transistor T4 may be connected to a source terminal of the transistor T2, a first terminal of the capacitor C2 and a first terminal of the resistor R2. A bulk (or body) terminal of the transistor T2 may be connected (internally or externally) to the source terminal of the transistor T2. The second supply voltage VEE may be presented to an emitter terminal of the transistor T4, a second terminal of the capacitor C2, and a second terminal of the resistor R2.

A node formed by connection of a drain terminal of the transistor T1 to a drain terminal of the transistor T2 may be coupled to the output 108 of the circuit 100. In various applications, the output 108 of the circuit 100 may be coupled (e.g., directly or through a radio frequency choke) to an anode terminal of the PIN diode to be biased or driven (e.g., the PIN diode 110). In various embodiments, a cathode terminal of the PIN diode 110 may be coupled (e.g., directly or through a radio frequency choke) to the circuit ground potential GND. In an example, the output 108 of the circuit 100 is coupled to the PIN diode 110 through an inductor selected to block an RF signal being switched (or attenuated) by the PIN diode 110.

In an example using hybrid or SMT construction, the driver circuit 100 may be implemented using a number of discrete components (e.g., mounted on a circuit board). The transistor T1 may be implemented using a −9 Amp P-Channel Fairchild FDMC86261P MOSFET with a typical fall time of 9.2 ns and a delay time of 18 ns. The transistor T2 may be implemented using a 7.5 Amp N-Channel Fairchild FDMC86116LZ MOSFET with a typical rise time of 4.5 ns and delay time of 10 ns. The transistor T3 may be implemented using a 40V PNP bipolar transistor MMBT2906. The transistor T4 may be implemented using an 80V NPN bipolar transistor BC846. The capacitors C1 and C2 may be implemented using 0.22 microfarad capacitors (e.g., Panasonic ECJ0EB0J224M). The resistors R1 and R2 may be implemented using 6.8 ohm, 1/10 watt resistors.

The level shifter 120 generally converts levels of the signal CTL to levels appropriate for driving the transistor T2. In an example where the signal CTL is TTL compliant, the level shifter 102 may comprise a logic gate 122, a transistor 124, a resistor 126, and a resistor 128. The logic gate 122 may be implemented as an inverter. The transistor 124 may be implemented as a MOSFET. The resistors 126 and 128 may be arranged as a voltage divider. The signal CTL may be presented to an input of the logic gate 122. An output of the logic gate 122 may be coupled to a gate terminal of the transistor 124. A source terminal of the transistor 124 may be coupled to the first supply voltage VCC. A drain terminal of the transistor 124 may be coupled to a first terminal of the resistor 126. A second terminal of the resistor 126 may be connected to a first terminal of the resistor 128. A second terminal of the resistor 128 may be coupled to the second supply voltage VEE. A node formed by the connection of the second terminal of the resistor 126 and the first terminal of the resistor 128 may be connected to the output of the level shifter 120.

In various embodiments, the transistors T1 and T2 along with the capacitors C1 and C2 are configured for generating the spiking currents. The bipolar transistors T3 and T4 along with the resistors R1 and R2 are configured for current limiting and setting steady state bias current. The capacitors C1 and C2 generally provide an initial shunt path for the spiking current and only after a certain amount of time does the voltage across the capacitors $$V\text{cap} = (1/C) * I * \Delta t \qquad \text{(EQ. 1)}$$

reach values high enough to forward bias the base-emitter junctions of the bipolar transistors T3 and T4. Since the transistors T1 and T2 act as voltage controlled current sources and since the transistors T1 and T2 take very little charge to turn on and off, the transistors T1 and T2 are able to source large amounts of spiking current in a very short amount of time.

Referring to FIG. 3, a diagram is shown illustrating an example implementation of a shunt topology PIN diode radio frequency (RF) attenuator or switch circuit 200 controlled using a PIN driver circuit (e.g., the circuit 100) in accordance with an example embodiment of the invention. The circuit 200 may comprise an RF input 202, a DC blocking capacitor 204, a DC blocking capacitor 206, an RF output 208, a PIN diode 210, and a radio frequency choke (RFC) 212. In some embodiments, the circuit 200 may also comprise an optional DC blocking capacitor 214. An input RF signal (e.g., RF_IN) may be presented to the RF input 202. The RF input 202 may be connected to a first terminal of the capacitor 204. A second terminal of the capacitor 204 may be connected to a first terminal of the capacitor 206, an anode terminal of the PIN diode 210 and a first terminal of the RF choke 212. A second terminal of the capacitor 206 may be connected to the RF output 208. An output signal (e.g., RF_OUT) may be presented at the RP output 208. A cathode terminal of the PIN diode 210 may be connected to a circuit ground potential. An output of the PIN driver circuit 100 may be applied to a second terminal of the radio frequency choke 212. In some embodiments, the second terminal of the radio frequency choke 212 may be connected to a first terminal of the optional blocking capacitor 214. A second terminal of the optional blocking capacitor 214 may be connected to the circuit ground potential.

Referring to FIG. 4, a schematic diagram is shown illustrating another example implementation of a shunt topology PIN diode radio frequency (RF) attenuator or switch 300 controlled using a PIN driver circuit (e.g., the circuit 100) in accordance with an example embodiment of the invention. The switch 300 may comprise an RF input 302 and an RF output 304. The RF input 302 may be connected directly to the RF output 304 by a wire (or trace) 306. A first terminal of a radio frequency choke (RFC) 308 may be connected to the wire 306. A second terminal of the RFC 308 may be connected to a circuit ground potential. A cathode terminal of a PIN diode 310 may be connected to the wire 306. An anode terminal of the PIN diode 310 may be connected to a first terminal of a DC blocking capacitor 312 and a first terminal of a RFC 314. A second terminal of the DC blocking capacitor 312 may be connected to the circuit ground potential. A second terminal of the RFC 314 may be connected to an output of the circuit 100. The RFC 308 generally provides a DC return path for DC bias currents generated by the circuit 100.

Figure 5:
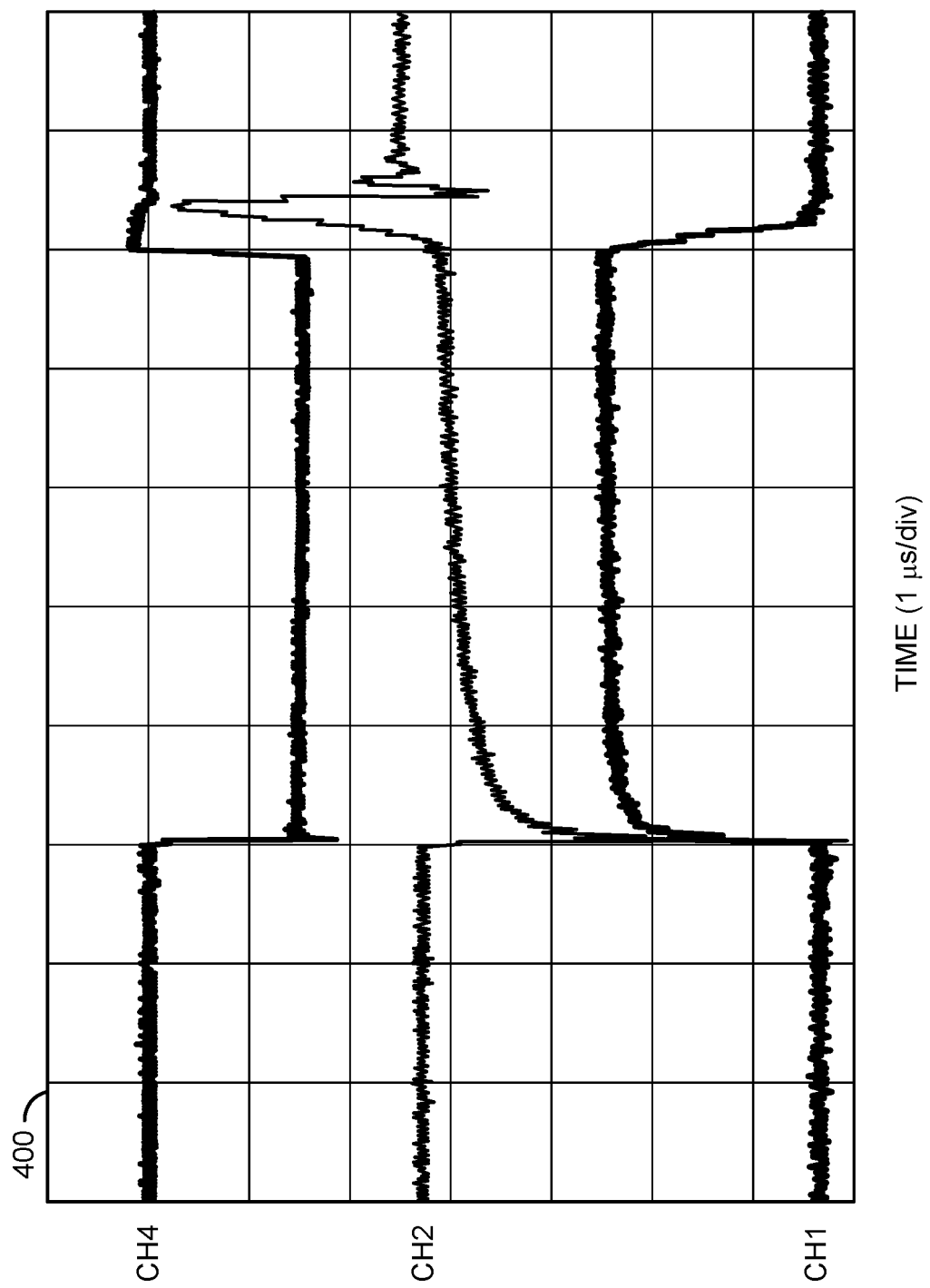
FIG. 5 is a diagram illustrating spiking current examples as seen on an oscilloscope for the driver circuit of FIG. 2 driving a shunt stripline PIN diode.

Referring to FIG. 5, a diagram of an oscilloscope display 400 is shown illustrating a spiking current observed with switching a shunt stripline PIN diode on and off using a PIN diode driver circuit in accordance with an example embodiment of the invention. A first channel (e.g., CH4) shows the analog input to the PIN diode. A second channel (e.g., CH2) shows the spiking current. A third channel (e.g., CH1) shows the detected RF. For a pulse having a 5 μs pulse width and a 5% duty cycle, the measured spiking current has a 1200 mA negative peak with about a 40 ns pulse width and a 600 mA positive peak with about a 300 ns pulse width. The shunt stripline PIN diode had a 2000 ns 50% lifetime and a 4500 ns 90% lifetime.

Figure 6:
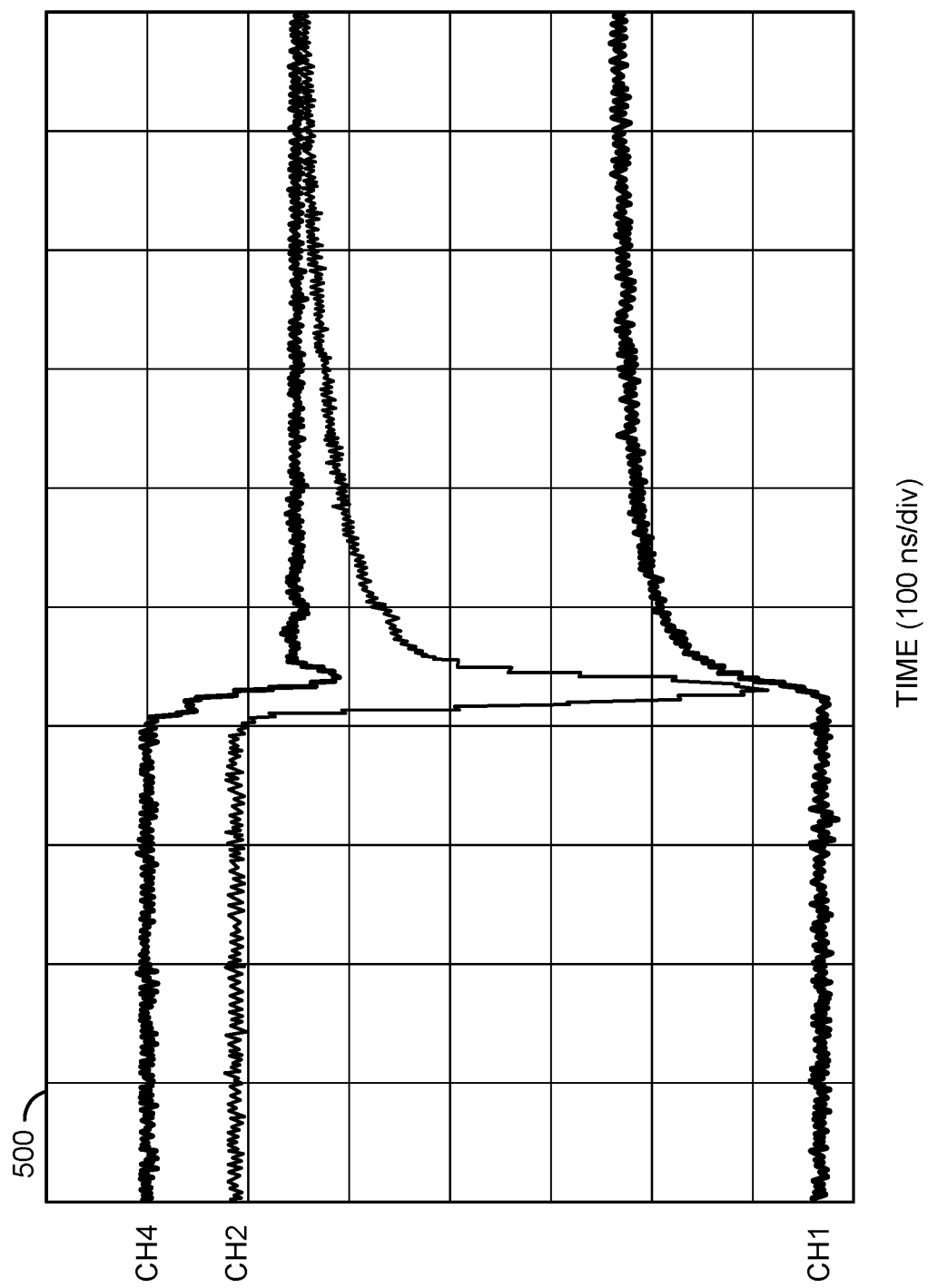
FIG. 6 is a diagram illustrating a negative spiking current of FIG. 5.

Referring to FIG. 6, a diagram of an oscilloscope display 500 is shown illustrating an expanded view of the negative spiking current pulse portion of the waveforms of FIG. 5.

Figure 7:
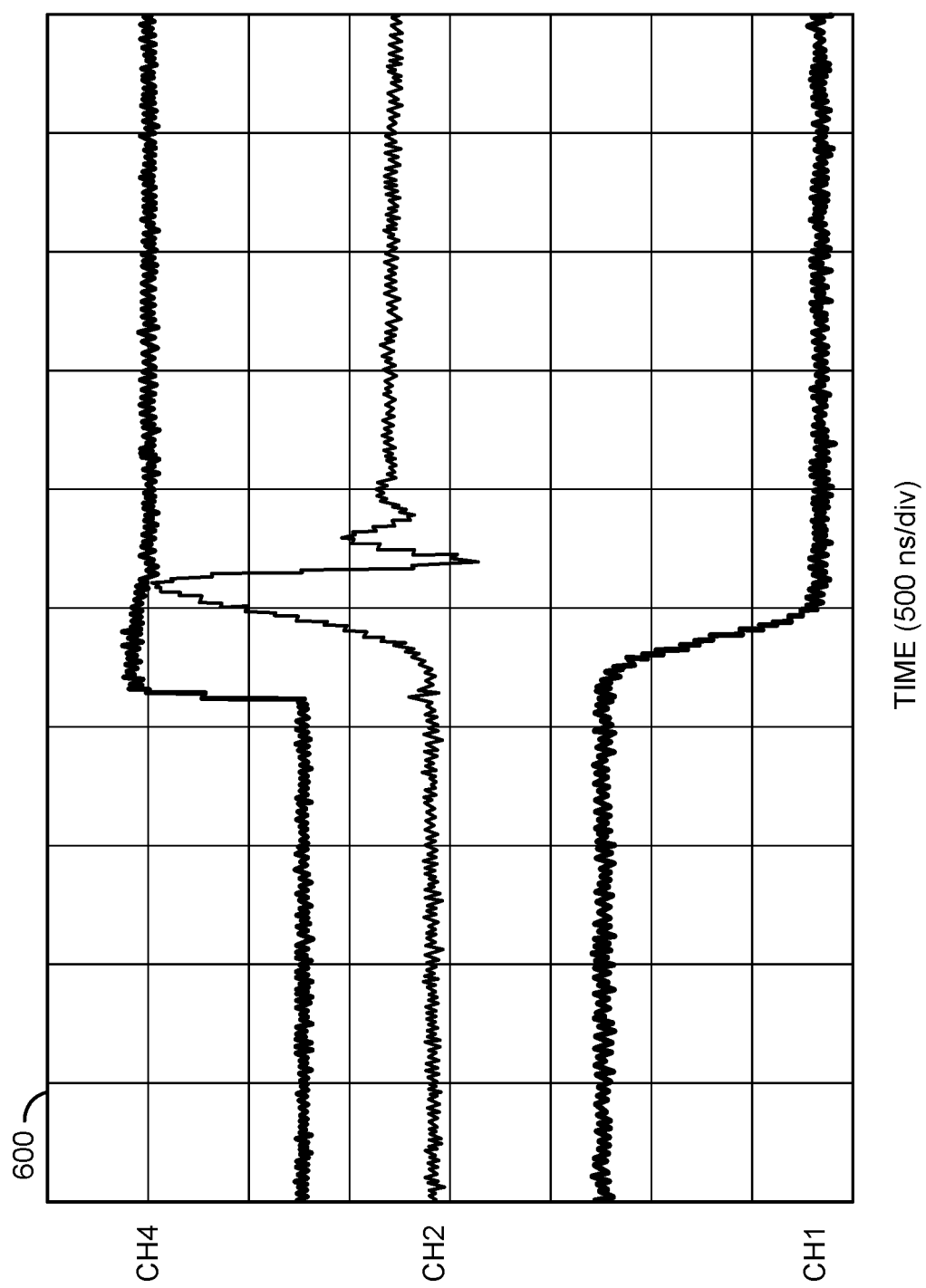
FIG. 7 is a diagram illustrating a positive spiking current of FIG. 5.

Referring to FIG. 7, a diagram of an oscilloscope display 600 is shown illustrating an expanded view of the positive spiking current pulse portion of the waveforms of FIG. 5. An RF turn-off of time of 125 ns is shown.

Referring to FIG. 8, a schematic diagram is shown illustrating an example implementation of a series mode PIN diode RF attenuator or switch 700 controlled using a PIN diode driver circuit (e.g., the circuit 100) in accordance with an example embodiment of the invention. The switch 700 may comprise an RF input 702, a DC blocking capacitor 704, a radio frequency choke 706, a PIN diode 708, a radio frequency choke 710, and an RF output 712. A radio frequency input signal RF_IN may be presented to the RF input 702. The RF input 702 may be connected to a first terminal of the DC blocking capacitor 704. A second terminal of the DC blocking capacitor 704 may be connected to a first terminal of the radio frequency choke 706 and an anode terminal of the PIN diode 708. A cathode terminal of the PIN diode 708 may be connected to a first terminal of the radio frequency choke 710 and the RF output 712. A second terminal of the radio frequency choke 710 may be connected to a circuit ground potential. The radio frequency output 712 presents an RF output signal (e.g., RF_OUT). An output of the PIN diode driver circuit 100 may be connected to a second terminal of the radio frequency choke 706.

In various embodiments, a high speed PIN diode spiking driver circuit is provided that is capable of radio frequency (RF) switching a PIN diode faster than the carrier lifetime of the PIN diode divided by 100, in the most difficult direction where charge needs to be withdrawn from the I-region of the PIN diode. In various embodiments, a turn-off time of 125 ns has also been achieved using the same high speed PIN diode spiking driver circuit. Using a 30% to 70% criterion, a shunt stripline PIN diode coupled to a driver circuit in accordance with an example embodiment of the invention demonstrated an RF turn on of 40 ns, which is equivalent to the 90% lifetime divided by 112. Since the diode is a shunt topology, the RF turn on (turning the shunt diode off and removing charge from the I-region) should be the most difficult (slowest) direction for switching. However, the opposite was observed. The RF turn-off (turning the shunt diode on and inserting charge into the I-region) was observed as being about 125 ns. The high speed PIN diode spiking driver circuit may provide faster PIN diode switching speeds to support increasing data rates and increasingly demanding radar requirements.

The invention may also be implemented by the preparation of ASICs (application specific integrated circuits), ASSPs (application specific standard products), RFICs (radio frequency integrated circuits), one or more MMICs (monolithic microwave integrated circuits), one or more chips or die arranged as flip-chip modules and/or multi-chip modules or by interconnecting an appropriate network of conventional component circuits, as is described herein, modifications of which will be readily apparent to those skilled in the art(s).

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first circuit configured to inject charge into an I-region of a PIN diode in response to a first state of a control signal; and
a second circuit configured to remove charge from said I-region of said PIN diode in response to a second state of said control signal, wherein said first circuit and said second circuit reduce a switching time of said PIN diode.

2. The apparatus according to claim 1, wherein said first circuit and said second circuit form a PIN diode driver circuit and reduce said switching time of said PIN diode to about two orders of magnitude lower than a carrier lifetime of said PIN diode.

3. The apparatus according to claim 1, wherein:
said first circuit comprises an enhancement mode p-channel field effect transistor, coupled with a PNP bipolar transistor, a first capacitor, and a first resistor; and
said second circuit comprises an enhancement mode n-channel field effect transistor, coupled with an NPN bipolar transistor, a second capacitor, and a second resistor.

4. The apparatus according to claim 3, wherein:
said p-channel field effect transistor comprises a p-channel metal-oxide-semiconductor field effect transistor (MOSFET); and
said n-channel field effect transistor comprises an n-channel MOSFET.

5. The apparatus according to claim 3, wherein:
said first resistor and said first capacitor are coupled in parallel between a first supply voltage and a source terminal of said p-channel field effect transistor;
said second resistor and said second capacitor are coupled in parallel between a second supply voltage and a source terminal of said n-channel field effect transistor; and
a drain terminal of said p-channel field effect transistor is coupled to a drain terminal of said n-channel field effect transistor.

6. The apparatus according to claim 5, wherein:
an emitter terminal of said PNP bipolar transistor is coupled to said first supply voltage, a base terminal of said PNP bipolar transistor is coupled to said source terminal of said p-channel field effect transistor, and a collector terminal of said PNP bipolar transistor is coupled to a gate terminal of said p-channel field effect transistor; and
an emitter terminal of said NPN bipolar transistor is coupled to said second supply voltage, a base terminal of said NPN bipolar transistor is coupled to said source terminal of said n-channel field effect transistor and a collector terminal of said NPN bipolar transistor is coupled to a gate terminal of said n-channel field effect transistor.

7. The apparatus according to claim 6, further comprising a level shifter circuit, wherein:
said control signal is presented to said gate terminal of said p-channel field effect transistor and an input of said level shifter circuit; and
an output of said level shifter circuit is coupled to said gate terminal of said n-channel field effect transistor.

8. The apparatus according to claim 1, wherein said PIN diode comprises a stripline shunt topology PIN diode.

9. The apparatus according to claim 1, wherein said apparatus comprises a radio frequency transceiver.

10. The apparatus according to claim 1, wherein said first and said second circuits are formed on a monolithic microwave integrated circuit.

11. The apparatus according to claim 1, wherein said first and said second circuits comprise discrete electronic devices.

12. A method of switching radio frequencies using a PIN diode, said method comprising:
injecting charge into an I-region of said PIN diode in response to a control signal having a first state; and
removing charge from said I-region of said PIN diode in response to said control signal having a second state, wherein said injecting and said removing reduce a switching time of said PIN diode.

13. The method according to claim 12, wherein said PIN diode comprises a stripline shunt topology PIN diode configured as a shunt mode radio frequency attenuator or switch.

14. The method according to claim 12, wherein said PIN diode is configured as a series mode radio frequency attenuator or switch.

15. The method according to claim 12, wherein a radio frequency turn on time of said PIN diode is equivalent to a 90 percent carrier lifetime of said PIN diode divided by at least 100.

16. The method according to claim 15, wherein said turn on time is measured using a 30 percent to 70 percent criterion.

17. The method according to claim 12, wherein:
said charge is injected into said I-region of said PIN diode using a first circuit;
said charge is removed from said I-region of said PIN diode using a second circuit; and
said injecting and said removing reduce said switching time of said PIN diode to about two orders of magnitude lower than a carrier lifetime of said PIN diode.

18. The method according to claim 17, wherein:
said first circuit comprises an enhancement mode p-channel field effect transistor, coupled with a PNP bipolar transistor, a first capacitor, and a first resistor; and
said second circuit comprises an enhancement mode n-channel field effect transistor, coupled with an NPN bipolar transistor, a second capacitor, and a second resistor.

19. The method according to claim 18, wherein:
said p-channel field effect transistor comprises a p-channel metal-oxide-semiconductor field effect transistor (MOSFET); and
said n-channel field effect transistor comprises an n-channel MOSFET.

20. The method according to claim 19, wherein:
said first resistor and said first capacitor are coupled in parallel between a first supply voltage and a source terminal of said p-channel field effect transistor;
said second resistor and said second capacitor are coupled in parallel between a second supply voltage and a source terminal of said n-channel field effect transistor;
an emitter terminal of said PNP bipolar transistor is coupled to said first supply voltage, a base terminal of said PNP bipolar transistor is coupled to said source terminal of said p-channel field effect transistor, and a collector terminal of said PNP bipolar transistor is coupled to a gate terminal of said p-channel field effect transistor;
an emitter terminal of said NPN transistor is coupled to said second supply voltage, a base terminal of said NPN bipolar transistor is coupled to said source terminal of said n-channel field effect transistor and a collector terminal of said NPN bipolar transistor is coupled to a gate terminal of said n-channel field effect transistor; and
a drain terminal of said p-channel field effect transistor is coupled to a drain terminal of said n-channel field effect transistor and an anode terminal of said PIN diode.

* * * * *